United States Patent [19]

Fang et al.

[11] Patent Number: 4,566,080

[45] Date of Patent: Jan. 21, 1986

[54] BYTE WIDE EEPROM WITH INDIVIDUAL WRITE CIRCUITS

[75] Inventors: Sheng Fang, E. Palo Alto; Kameswara K. Rao, Santa Clara, both of Calif.

[73] Assignee: Signetics Corporation, Sunnyvale, Calif.

[21] Appl. No.: 512,853

[22] Filed: Jul. 11, 1983

[51] Int. Cl.[4] .................. G11C 7/00; G11C 11/40
[52] U.S. Cl. .................... 365/185; 365/195; 365/189
[58] Field of Search .............. 365/184, 185, 189, 218, 365/205, 195, 104, 182

[56] References Cited

U.S. PATENT DOCUMENTS

| 4,090,258 | 5/1978 | Cricchi | 365/184 |
| 4,149,270 | 4/1979 | Cricchi et al. | 365/184 |
| 4,354,256 | 10/1982 | Miyasaka | 365/189 |
| 4,377,857 | 3/1983 | Tickle | 365/185 |
| 4,477,884 | 10/1984 | Iwahashi et al. | 365/189 |

FOREIGN PATENT DOCUMENTS 0137933 10/1979 Japan .................. 365/185

Primary Examiner—Stuart N. Hecker
Assistant Examiner—Glenn A. Gossage
Attorney, Agent, or Firm—Robert T. Mayer

[57] ABSTRACT

A memory system of the EEPROM type in which a separate writing circuit is provided for each cell of a related byte thereby permitting one cell to be charged while the other can be simultaneously discharged.

5 Claims, 8 Drawing Figures

BYTE WIDE EEPROM WITH INDIVIDUAL WRITE CIRCUITS

The invention relates to large scale integrated circuit memories. In particular, it relates to a new array arrangement for an EEPROM.

This application is related to U.S. patent application Ser. No. 512,858 entitled "One Step Write Circuit Arrangement for EEPROMS" filed concurrently herewith, assigned to the same assignee as this application and incorporated by reference herein.

One type of EEPROM is described in the article by Johnson et al entitled "16-K EE-PROM Relies on Tunneling for Byte-Erasable Program Storage" published in the Feb. 28, 1980 issue of Electronics magazine. The memory disclosed in that article uses floating gate field effect transistors for its memory cells. In the arrangement disclosed in the article an individual cell of a particular byte can not be charged separately from the other cells of that byte. Thus, in order to charge any cell of a byte all cells of that byte have to be charged whether they are to remain in the charged state or not. This clears the selected byte and allows those selected ones of its cells which are not to remain in the charged state to be discharged as desired. This can require two cycles of operation in order to change information in any particular cell of a byte namely, an erasing cycle where all of the selected cells of the memory are charged and a programming cycle where chosen ones of the cells are discharged.

It is an object of this invention to provide an improved EEPROM array arrangement.

One of the features of the invention is that each of the memory cells of a byte of memory is connectable to its own writing means separate from the writing means of the other cells of that byte. In this way one cell of a byte can be charged while another is simultaneously discharged.

An advantage of the invention is the decreased time it takes to change information in the array.

In accordance with the invention there is provided a memory system of the EEPROM type which includes a plurality of sections of columns and rows of memory cells forming a plurality of bytes of memory. Each section includes a writing circuit. Each row in each section includes one memory cell for each column in the section. Each section includes the same number of rows and the same number of columns. Each of the memory cells in the same row and column location in each section together comprise each byte of memory. Selection means selectively connects each cell of a byte to its assocated writing circuit simultaneously. Each writing circuit is thereby enabled to change information in its associated cell from a first state to a second state or vice versa independent of the change another writing circuit may be making in the information in its associated cell.

Other objects, features and advantages of the invention will be apparent to those skilled in the art from the following description and appended claims when considered in conjunction with the accompanying drawing in which:

Figure 1:
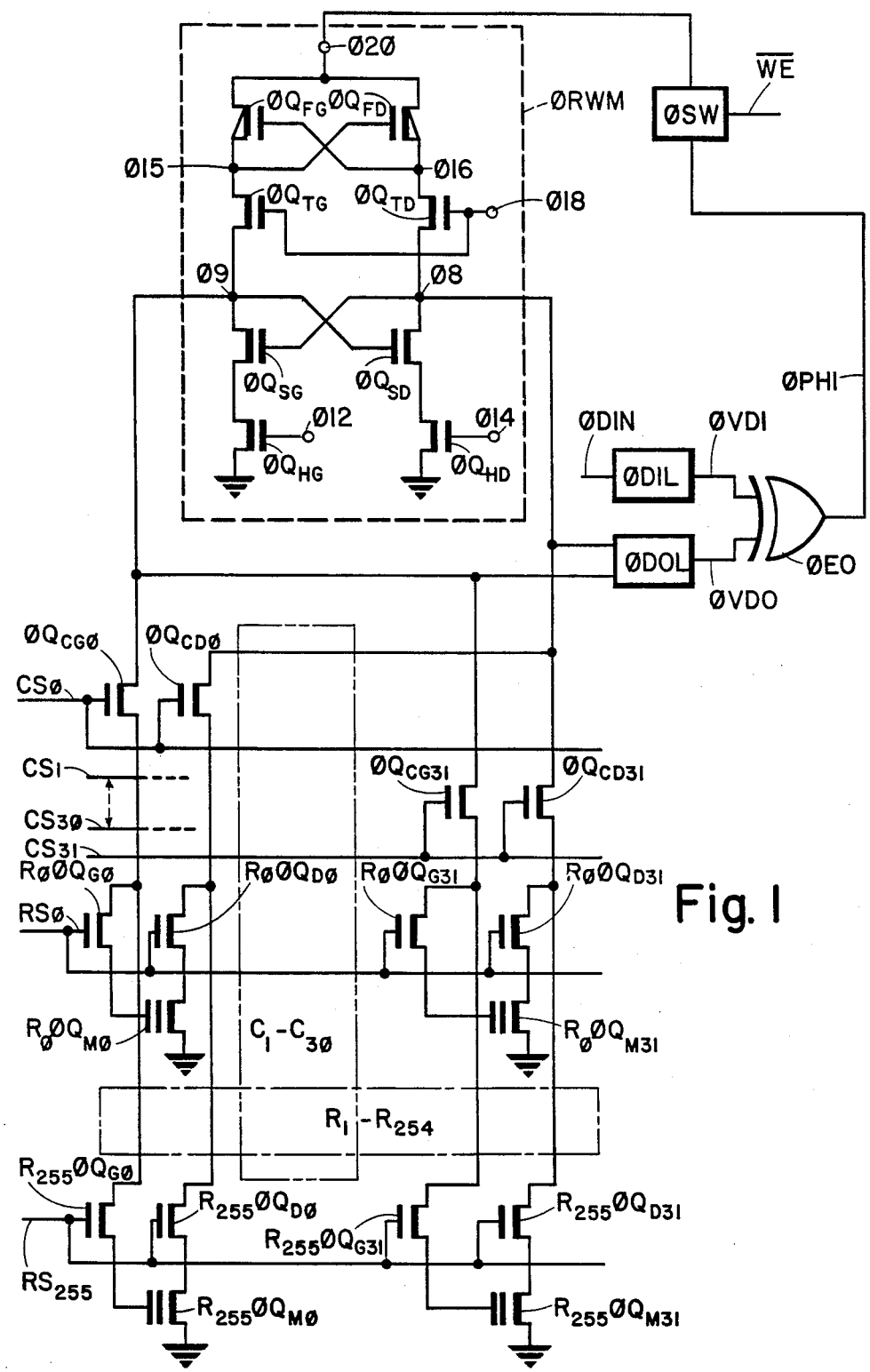
FIG. 1 is a simplified diagram of one of eight sections of an EEPROM array, each section containing 8192 memory cells arranged in 32 columns and 256 rows.

Referring to FIG. 1, there is shown therein a first of eight sections of an EEPROM array, each section containing 8192 memory cells arranged in 32 columns and 256 rows. Four floating gate field effect transistors $R_0 0 Q_{M0}$, $R_0 0 Q_{M31}$, $R_{255} 0 Q_{M0}$, and $R_{255} 0 Q_{M31}$ of the first section of the EEPROM array are illustrated. These transistors are the memory cell of the first row of the first column, the memory cell of the first row of the 32nd column and the memory cells of the 256th row, first column and 32nd column all of the first section. The memory cells of the second through 31st column of the first section are not shown for simplication purposes and are designated as the vertically disposed dotted line box marked C1-C30. Likewise the second through 255th rows of memory cells of the first section are also not shown for purposes of simplification and are designated as the horizontally disposed dotted line box identified as R1-R254.

Each of the memory cells of the first section is associated with two of its own row select conventional field effect transistors identified by the references $R_0 0 Q_{G0}$, $R_0 0 Q_{D0}$; $R_0 0 Q_{G31}$, $R_0 0 Q_{D31}$; $R_{255} 0 Q_{G0}$, $R_{255} 0 Q_{D0}$ and $R_{255} 0 Q_{G31}$, $R_{255} 0 Q_{D31}$ for the four illustrated cells.

All the memory cells in a column of the first section are associated with two column select field effect transistors, such as $0 Q_{CG0}$, $0 Q_{CD0}$ and $0 Q_{CG31}$, $0 Q_{CD31}$ for the first and 32nd columns.

Figure 2:
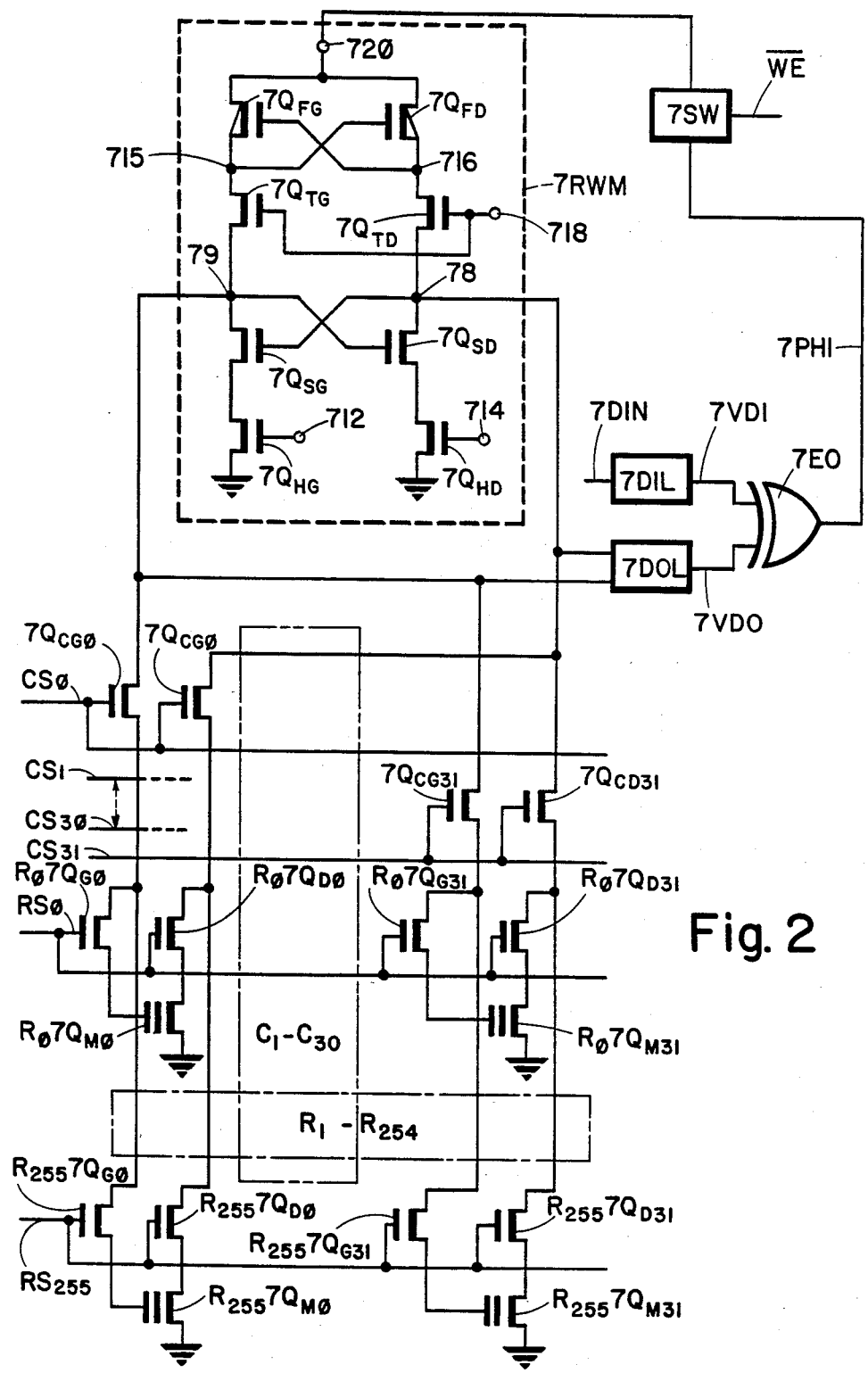
FIG. 2 is a simplified diagram of another one of the eight sections.

By referring to FIG. 2 it will be understood that there is shown therein identical memory cells as just described for the first section except that FIG. 2 shows the memory cells for the eighth section of the EEPROM array. Sections two through seven are not shown for simplification purposes, each being identical to sections one and eight. Each section contains one memory cell of each eight cell byte of the array. Thus by selecting the same row and column in each section one can read out or write into all eight cells of the associated byte.

For simplification purposes hereinafter each memory cell transistor will be designated as $Q_M$ and its associated conventional field effect transistor connected to its gate will be designated $Q_G$ for gate select transistor (see FIG. 3). The conventional field effect transistor whose source is connected to its associated memory cells drain will be designated $Q_D$ for drain select transistor. This disregards row location and column location. In each memory cell group the gate select transistor $Q_G$ has its drain connected to the column select line and its source connected to the gate of the floating gate memory cell transistor $Q_M$. The drain select transistor $Q_D$ of each cell group has its drain connected to a column select line and its source connected to the drain of the memory cell floating gate transistor $Q_M$. The source of each memory cell transistor $Q_M$ is connected to ground. The gates of both the gate select transistor $Q_G$ and the drain select transistor $Q_D$ in each row in each column is connected to its associated row select line RS.

The drains of each gate select transistor $Q_G$ and each drain select transistor $Q_D$ are connected to lines 9 and 8, respectively, of reading and writing circuit RWM through associated column select transistors $Q_{CG}$ and $Q_{CD}$.

Reading and writing circuit RWM for each section comprises a gate column select circuit comprising transistors $Q_{FG}$, $Q_{TG}$, $Q_{SG}$ and $Q_{HG}$ and its complementary drain column select circuit including transistors $Q_{FD}$, $Q_{TD}$, $Q_{SD}$ and $Q_{HD}$.

Figure 3:
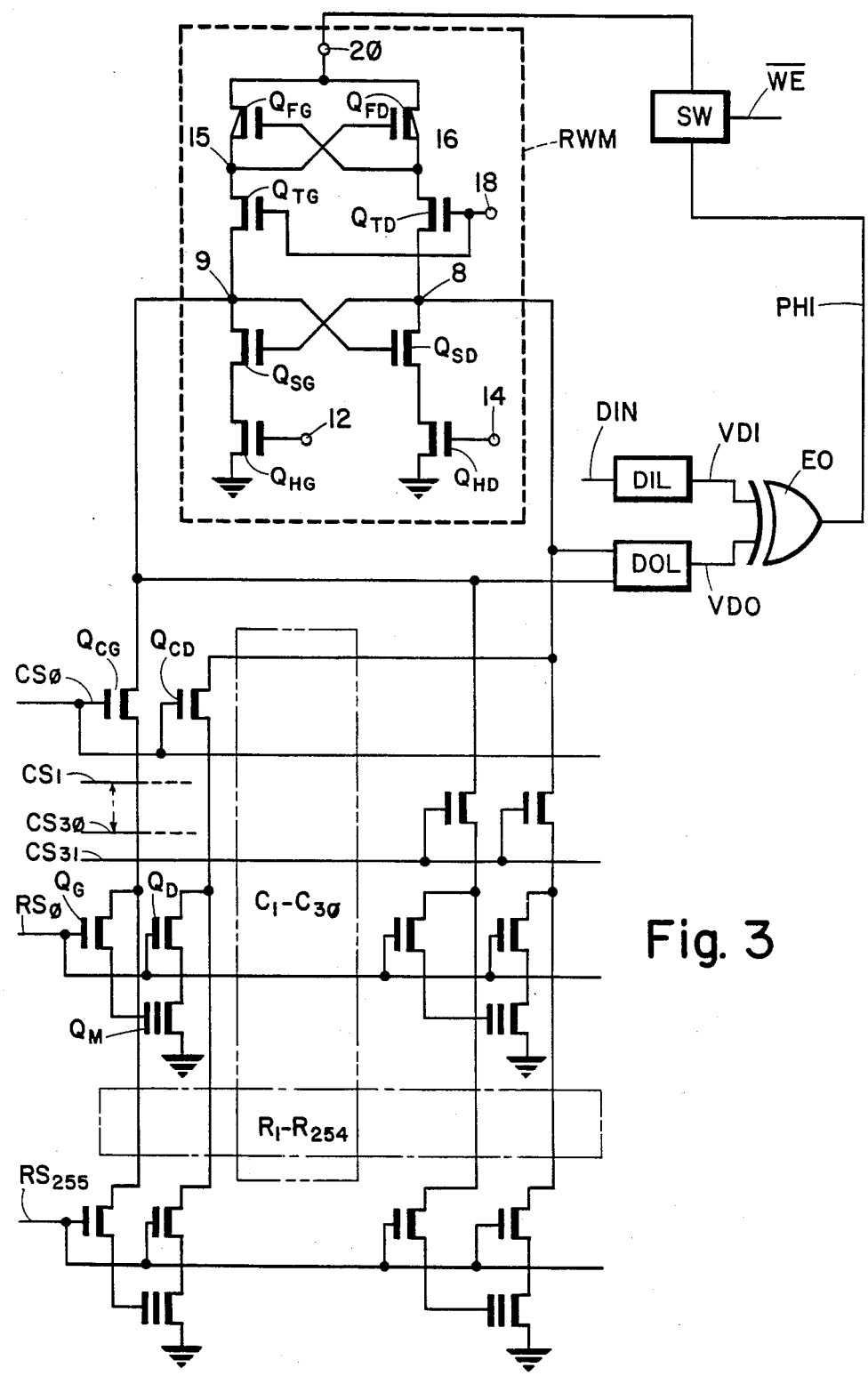
FIG. 3 is an exemplary diagram of one of the eight sections.

All transistors shown in FIG. 3 are field effect N-channel devices except for transistors $Q_{FG}$ and $Q_{FD}$ which are P-channel devices. These latter two transistors are arranged in a flipflop circuit and together with transistors $Q_{TG}$ and $Q_{TD}$ provide connections from terminal 20 to lines 8 and 9. As will be described later the flipflop circuit is in a first state to charge an associated memory cell and in a second state to discharge it. Transistors $Q_{SG}$ and $Q_{SD}$ provide a second flipflop circuit and these together with transistors $Q_{HG}$ and $Q_{HD}$ provide connections from lines 9 and 8 to ground.

Figure 4:
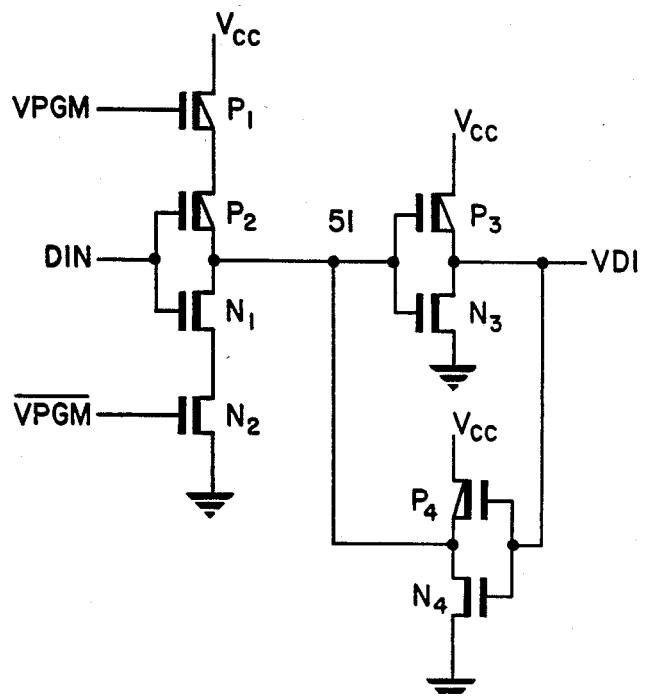
FIG. 4 is a detailed circuit diagram of one of the elements of FIG. 3.
Figure 5:
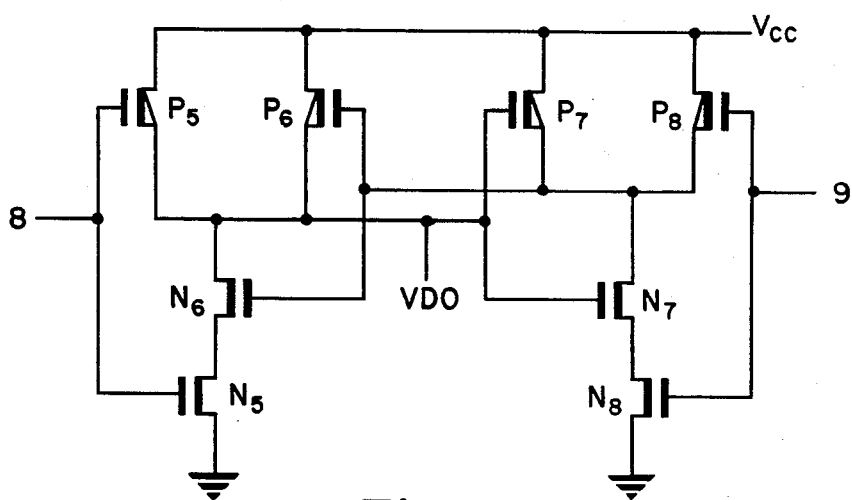
FIG. 5 is a detailed circuit diagram of another of the elements of FIG. 3.
Figure 6:
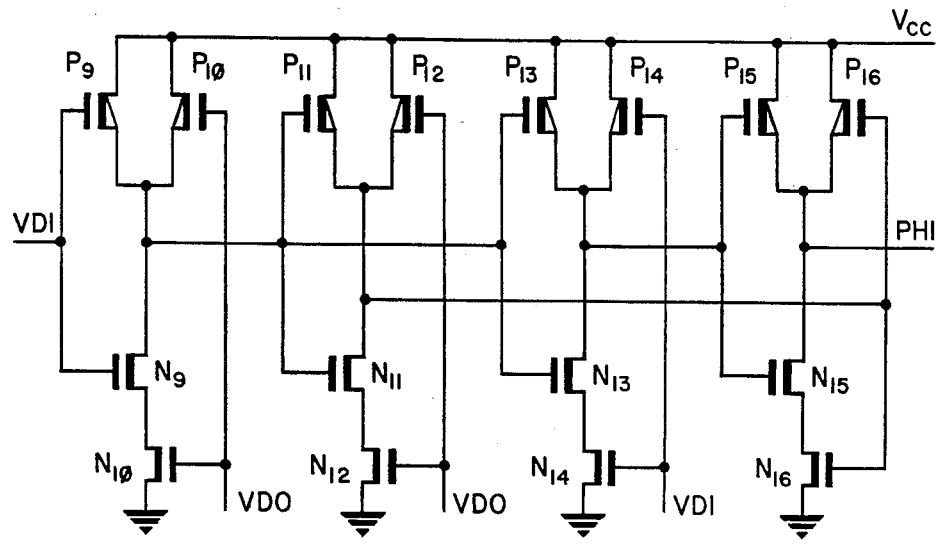
FIG. 6 is a detailed circuit diagram of still another of the elements of FIG. 3.

Also shown in FIG. 3 is a representative writing means for one section of the array including an input signal latch DIL and an output signal latch DOL. The inputs of output signal latch DOL are connected to lines 8 and 9 of reading and writing circuit RWM which is also part of the representative writing means. Output line VDO of the writing means is connected to one input of a comparison means comprising exclusive OR EO. The input of data input latch DIL is connected to data input line DIN and its output line VDI is connected to the second input of exclusive OR EO. The output of the exclusive OR is connected to an input of switch SW. Another input is connected to line WE. The output from switch SW is connected to terminal 20 of reading and writing circuit RWM. It will simplify the explanation of the operation of data input latch DIL if it is understood that in accordance with the invention a writing operation is always preceded by a reading operation. This provides that feature of the invention which causes a writing operation to take place only if the data in a memory cell is to be changed. In addition, data input latch DIL only needs to be switched if the next input to a cell is different from the last input through the latch. Thus, if the last input switched the latch to place a binary 1 on line VDI, this caused N-channel gate N4 in FIG. 4 to turn on which maintains a binary 0 at terminal 51. This keeps P-channel gate P3 on and $V_{cc}$ potential (binary 1) stays on line VDI. Throughout the remainder of this description of FIGS. 4 through 7 N-channel gates are identified by the prefix letter N and P-channel gates by the prefix letter P.

If it is desired to change a cell from a binary 1 to a binary 0, the conditions recited above prevail when the reading cycle begins, except that a binary 0 appears on line DIN. This turns on P-channel gate P2 and maintains N-channel gate N1 off. During reading cycles the signal on line VPGM is low and this turns on P-channel gate P1. Thus $V_{cc}$ potential (binary 1) appears at terminal 51. This turns off gate P3 and turns on gate N3 placing ground potential (binary 0) on line VDI. Consequently, gate N4 turns off and gate P4 turns on to maintains terminal 51 at the binary 1 level.

To change a cell from the binary 0 level to the binary 1 level, the conditions recited at the end of the paragraph above prevail when the reading cycle preceding the writing cycle begins. Then a binary 1 appears on line DIN. This turns gate N1 on and maintains gate P1 off. During reading cycles line $\overline{VPGM}$ is high and gate N2 also turns on. This puts ground potential (binary 0) at terminal 51. Consequently, gate N3 turns off and gate P3 turns on to apply $V_{cc}$ potential (binary 1) on line VDI. This turns off gate P4 and turns on gate N4 to keep ground potential (binary 0) at terminal 51.

Data output latch DOL (FIG. 5) provides a binary 1 signal along line VDO when line 8 is at binary 0 and line 9 is at binary 1. It provides a binary 0 signal along line VDO when line 8 is at binary 1 and line 9 is at binary 0. With a binary 0 on line 8 gate P5 (FIG. 5) is on and gate N5 is off. $V_{cc}$ potential (binary 1) is applied through gate P5 to line VDO and to gate N7 to turn it on. Gate N8 is on by virtue of the binary 1 on line 9. Therefore, ground potential (binary 0) is applied to gate P6 to turn it on. As a result, $V_{cc}$ potential (binary 1) is maintained on line VDO through gate P6.

In the alternative condition with line 8 high and line 9 low, gates N5, N6 and P8 are turned on to apply ground potential (binary 0) to line VDO.

Exclusive OR EO produces a binary 1 signal if either one but only one of its input lines VDI or VDO carry a binary 1. In all other conditions it provides a binary 0 for its output line PHI. Assuming a binary 1 applied along VDI and a binary 0 along VDO, gate P10 (FIG. 6) is turned on to apply a binary 0 to gate N13 to turn it on. At the same time gate N14 is on and ground or binary 0 is applied through it and gate N13 to gate P15 to turn it on which applies a binary 1 along line PHI. If binary 1 signals appear along both lines VDI and VDO gates N9 and N10 are both turned on applying binary 0's to gates P10 and P13 to turn them on also. One applies a binary 1 to gate N16 and the other to gate N15 turning both on to apply ground potential (binary 0) along line PHI.

If binary 0's are applied along both line VDI and VDO, gates P12 and P14 are both turned on to apply binary 1 signals to gates N15 and N16. These both turn on again to apply a binary 0 along line PHI.

If a binary 0 is applied along line VDI and a binary 1 along line VDO, gate P9 is turned on to apply a binary 1 to gate N11 turning it on. Gate N12 is turned on by the binary 1 along line VDO. These then connect ground to gate P16 turning it on to apply $V_{cc}$ potential (binary 1) to line PHI.

Figure 7:
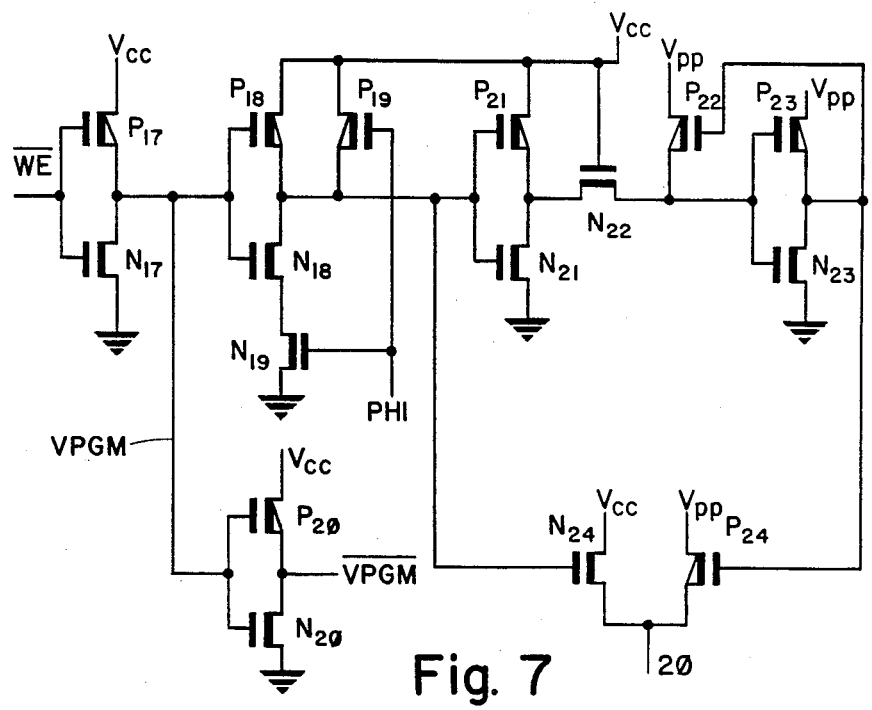
FIG. 7 is a detailed circuit diagram of yet another of the elements of FIG. 3.

Shown in FIG. 7 is the detailed circuitry of switch SW for transferring the voltage applied to terminal 20 of reading and writing circuit RWM from the reading potential $V_{cc}$ to the writing potential $V_{pp}$. A signal applied along line $\overline{WE}$ is inverted by the inverter formed by gates P17 and N17. A binary 1 signal along line $\overline{WE}$ indicates a reading operation and causes a binary 0 to be applied along line VPGM. The inverter formed by gates P20 and N20 inverts this to apply a binary 1 along line $\overline{VPGM}$. Under these conditions gate P18 is turned on and a binary 1 is applied to gates N21 and N24 turning them on. Gate N21 applies ground to gate P23 turning gate P23 on and gates P22 and P24 off. Gate N24 applies $V_{cc}$ potential (reading voltage) to terminal 20 of reading and writing circuit RWM.

When a writing operation is desired line VPGM goes high and line $\overline{VPGM}$ goes low but without effect if line PHI remains at a binary 0 indicating a change in information is not needed in its associated memory cell.

Assuming a change in information is desired when VPGM goes high gate N18 is turned on. When PHI goes high gate N19 is turned on and ground potential is applied to both N21 and N24 turning both off. This removes $V_{cc}$ potential from terminal 20 of reading and writing circuit RWM. The ground applied through gates N18 and N19 turns gate P21 on which, in turn, turns gate P23 off and gate N23 on. This applies ground potential to gate P24 turning it on and applying the writing potential $V_{pp}$ to terminal 20 of the reading and writing circuit RWM.

Figure 8:
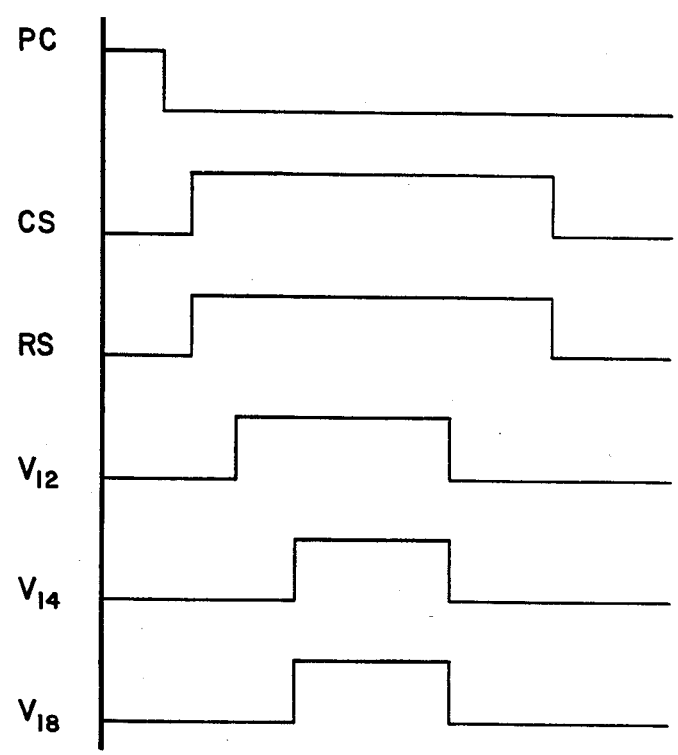
FIG. 8 is a timing circuit of some of the pulses used in performing the reading and writing cycles of the described memory.

The operation of one memory cell will now be described with reference to FIG. 3. To read a particular cell as is well known, a select voltage is applied to the column select line associated with that cell as well as to the row select line associated with that cell thereby addressing or selecting the cell. It is to be understood that the same row select line and column select line is simultaneously selected in each of the eight sections thereby addressing the whole byte. That is the only row select line and column select line so selected in each section and thus only one cell is selected in each section. Assume row zero and column zero to have been so selected, the select voltages (source not shown) cause transistors $Q_G$ and $Q_D$ together with transistors $Q_{CG}$ and $Q_{CD}$ to turn on. Also assume the floating gate of transistor $Q_M$ to be discharged, then this memory cell is in a first state which will be designated as having a binary 1 stored in it. As a consequence line 8 is at the ground potential of the source of transistor $Q_M$ when it ($Q_M$) is turned on by the voltage applied through transistor $Q_G$ from line 9 by the precharging of that line. (The precharging operation is not described as it is a well known operation to those skilled in the art.) At this time a reading voltage $V_{CC}$ is applied to terminal 20 from switch SW, as previously explained in connection with FIG. 7. When voltage $V_{12}$ is applied in any known manner to terminal 12 transistor $Q_{HG}$ is turned on but line 9 remains high because transistor $Q_{SG}$ remains off because of the low voltage applied to its gate from line 8. Thereafter when voltage $V_{14}$ (FIG. 8) is applied in any well known manner to terminal 14 transistor $Q_{HD}$ turns on and it and transistor $Q_{SD}$ (which has been turned on by the voltage at line 9) provide a path to ground for line 8. Subsequently, voltage $V_{18}$ (FIG. 8) is applied to terminal 18 in any well known manner to turn on both transistors $Q_{TG}$ and $Q_{TD}$. As a consequence terminal 15 goes high to the voltage of line 9 and terminal 16 goes low to the ground potential of line 8. This turns transistor $Q_{FG}$ on and applies voltage $V_{CC}$ to line 9 to maintain it at a high potential. A voltage differential with line 8 at a lower potential than line 9 indicates the storing of a binary 1 in transistor $Q_M$. This is signified by a binary 1 output from data output latch DOL along line VDO, as explained in connection with FIG. 5. This output along line VDO is applied to the lower input of exclusive OR EO without effect.

If the floating gate of memory cell $Q_M$ had been charged at the time the reading operation had started to indicate it in its second state, i.e. the storing of a binary 0 the cell would not conduct when the row select voltage was applied to line $RS_0$. As a result line 8 would remain high due to the precharging voltage. Therefore, transistor $Q_{SG}$ would be turned on. Consequently when voltage $V_{12}$ is applied to transistor $Q_{HG}$ to turn it on, a path to ground through transistors $Q_{SG}$ and $Q_{HG}$ is provided for line 9. Thus transistor $Q_{SD}$ is turned off by the ground potential along line 9 and when voltage $V_{14}$ is applied to transistor $Q_{HD}$ its turning on would be without effect. When voltage $V_{18}$ is applied to terminal 18 to turn on transistors $Q_{TG}$ and $Q_{TD}$, under these circumstances, terminal 15 would go to ground potential while terminal 16 remained high. The ground potential at terminal 15 would turn transistor $Q_{FD}$ on this time and the potential $V_{CC}$ applied to terminal 20 is in this case applied to line 8. A voltage differential with line 9 at a lower potential than line 8 indicates the storing of a binary 0 in the memory cell and, as explained causes data output latch DOL to produce a binary 0 from its output to be applied along line VDO to the lower input of exclusive OR EO. The operation of exclusive OR EO is without effect during a reading operation and can be ignored.

If a writing cycle is to take place the reading cycle as just explained is conducted preliminary to the writing operation. During a writing cycle a binary 0 or a binary 1 is applied along line DIN to data input latch DIL. As explained in connection with FIG. 4, either of these signals causes data input latch DIL to produce the corresponding signal at its output and apply it along line VDI to the upper input of exclusive OR EO. Since a writing operation is necessary only if the data in the memory cell is to be changed exclusive OR EO is used to determine this requirement. As explained in connection with FIG. 6, if the data stored in a memory cell is the same as that applied along line DIN either two zeros or two ones are applied along lines VDI and VDO to the inputs of exclusive OR EO. In either case a binary 0 is applied from the output of exclusive OR EO along line PHI to switch SW. This prevents a writing cycle from commencing since it is not needed in view of the fact that the information in the associated cell is not going to be changed.

Assuming a binary 1 is stored in transistor $Q_M$ and that a binary 0 is to be stored therein. Line 8 is low with respect to line 9 during the $V_{18}$ pulse and a binary 0 signal is applied along line VDI to the upper input of exclusive OR EO and a binary 1 is applied along line VDO to its lower input. This causes an output signal to be applied along line PHI to switch SW causing it (as previously explained in connection with FIG. 7) to transfer the voltage on terminal 20 from the reading voltage $V_{CC}$ to the higher writing voltage $V_{pp}$ when the writing cycle is initiated by the signal along line $\overline{WE}$ going low. The writing voltage $V_{pp}$ is applied through transistor $Q_{FG}$ and transistor $Q_{TG}$ to line 9 and through transistors $Q_{CG}$ and $Q_G$ to the gate of memory cell transistor $Q_M$. With its gate at the writing voltage potential and its source and drain both at ground potential the floating gate of transistor $Q_M$ is charged to change the Dnformation stored therein to a binary 0.

Assuming a binary 0 is stored in transistor $Q_M$ and that a binary 1 is to be written therein, line 8 is high with respect to line 9 when the pulse $V_{18}$ is applied to terminal 18. As a consequence data output latch DOL applies a binary 0 to the lower input of exclusive OR EO along line VDO while the data input latch DIL applies a binary 1 to its upper input along line VDI. Again switch SW applies the writing voltage $V_{PP}$ to terminal 20 in place of the reading voltage $V_{CC}$. This time, however, transistor $Q_{FG}$ is turned off and transistor $Q_{FD}$ is turned on as previously explained during the reading cycle operation. The writing voltage is thereby applied through transistor $Q_{FD}$ and transistor $Q_{TD}$ to line 8 and through transistors $Q_{CD}$ and $Q_D$ to the drain of memory cell transistor $Q_M$. With the writing voltage on its drain and the ground potential of line 9 applied through transistors $Q_{CG}$ and $Q_G$ on its gate the floating gate of memory cell transistor $Q_M$ is discharged. It thereafter stores a binary 1.

By comparing FIG. 1 with FIG. 2 it can be seen that when column "0" and row "0" are selected both the memory cell $R_0 0 Q_{M0}$ of the first section of the array (FIG. 1) and memory cell $R_0 7 Q_{M0}$ of the eighth section (FIG. 2) are simultaneously selected. Since each memory cell has its own writing means it can be seen that line 09 can be high or low with respect to line 08 of FIG. 1 independent of the relationship between line 79 and line 78 of FIG. 2. The same can be said for the other six bits of each byte. Because of this separation of each of the bits of every byte into separate sections it can be seen that the writing means of each section is operable during a writing cycle to write information in either state into a selected cell of a byte or not independently of the other selected cells of that byte.

With this arrangement it can be further seen that exclusive OR EO of the writing means of each section of the array enables the writing voltage to be applied only to the reading and writing circuit RWM associated with a cell where information is to be changed. This prevents such cells from being written into when not necessary.

Moreover, the separation of each of the bits of every byte into separate sections enables the writing circuits to write information in a first state into one selected cell containing information in a second state while simultaneously writing information in the second state into another selected cell containing information in said first state. Thus, assume the memory cell in a first bit position of column zero, row zero, namely $R_0 0 Q_{M0}$ (FIG. 1) has a binary 1 stored therein while the memory cell in the eighth bit position of column zero, row zero, namely $R_0 7 Q_{M0}$ (FIG. 2) has a 0 stored therein. With the present invention the former can be changed to a binary 0 during a writing cycle and the latter to a binary 1 simultaneously during the same writing cycle.

From the foregoing it is to be understood that various modifications to the above described arrangement of the invention will be evident to those skilled in the art. The arrangement described herein is for illustrative purposes and is not to be considered restrictive.

What is claimed is:

1. A memory system of the EEPROM type including a plurality of sections of rows and columns of memory cells forming a plurality of bytes of memory, each section including a writing circuit, each row in each section including one memory cell for each column in the section, each section including the same number of rows and the same number of columns, each of the memory cells in the same row and column location in each section together comprising each byte of memory and selection means for each section selectively connecting each cell of a byte to its associated writing circuit simultaneously, each said writing circuit thereby being enabled to change information in its associated cell electrically from a first state to a second state or vice versa independent of the change another writing circuit may be making electrically in the information stored in its associated cell, wherein each cell includes a floating gate field effect transistor ($Q_M$) and two conventional field effect transistors ($Q_G$, $Q_D$), each transistor including a source, a gate and drain, the source of one conventional transistor being connected to the gate of said floating gate transistor, the source of the other conventional transistor being connected to the drain of said floating gate field effect transistor, said gates of said conventional transistors being connected together and to said selection means, said selection means turning on both said conventional transistors to connect said floating gate transistor to its associated writing circuit.

2. A memory system of the EEPROM type according to claim 1, wherein said selection means connects only one cell in each section to its associated writing circuit at any time.

3. A memory system of the EEPROM type according to claim 2, wherein said writing circuit has two output terminals and said selection means includes a separate first column select transistor ($Q_{CG}$) for each column connecting the drains of all of said one conventional transistors ($Q_G$) in its column to one of said output terminals (9) and a separate second column select transistor ($Q_{CD}$) for each column connecting the drains of all of said other conventional transistors ($Q_D$) in its column to the other of said output terminals (8).

4. A memory system of the EEPROM type according to claim 3, including comparison means for each section preventing its associated writing circuit from operating if the information in its associated cell is to remain in the state it is in.

5. A memory system of the EEPROM type according to claim 4, wherein each writing circuit includes a flip-flop circuit ($Q_{FG}$, $Q_{FD}$) which is in a first state ($Q_{FGon}$) for applying a higher potential to said one output of its associated writing circuit than to said other output to charge an associated cell and in a second state for applying a higher potential to said other output of its associated writing circuit than to said one output to discharge an associated cell.

* * * * *